(12) United States Patent
Rozenblit et al.

(10) Patent No.: US 7,099,636 B2
(45) Date of Patent: Aug. 29, 2006

(54) CONTINUOUS CLOSED-LOOP POWER CONTROL SYSTEM INCLUDING MODULATION INJECTION IN A WIRELESS TRANSCEIVER POWER AMPLIFIER

(75) Inventors: Dmitriy Rozenblit, Irvine, CA (US); Morten Damgaard, Laguna Hills, CA (US); Russell J. Fagg, Irvine, CA (US); William J. Domino, Yorba Linda, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 469 days.

(21) Appl. No.: 10/392,102

(22) Filed: Mar. 18, 2003

(65) Prior Publication Data

US 2004/0198270 A1    Oct. 7, 2004

Related U.S. Application Data

(62) Division of application No. 09/704,930, filed on Nov. 2, 2000.

(51) Int. Cl.
*H01Q 11/12*    (2006.01)

(52) U.S. Cl. ........................ 455/126; 455/69; 455/127.1

(58) Field of Classification Search .................. 455/69, 455/522, 68, 70, 102, 108, 205, 114.2, 126, 455/127.1; 332/144, 145, 149, 151

See application file for complete search history.

(56) References Cited

U.S. PATENT DOCUMENTS

| | | | | |
|---|---|---|---|---|
| 5,241,694 A | * | 8/1993 | Väisänen et al. | 455/126 |
| 5,313,173 A | * | 5/1994 | Lampe | 332/103 |
| 5,430,416 A | * | 7/1995 | Black et al. | 332/145 |
| 5,835,848 A | | 11/1998 | Bi et al. | 455/24 |
| 5,946,346 A | * | 8/1999 | Ahmed et al. | 375/219 |
| 5,987,333 A | * | 11/1999 | Sole | 455/522 |
| 6,070,086 A | * | 5/2000 | Dobrica | 455/522 |
| 6,163,708 A | * | 12/2000 | Groe | 455/522 |
| 6,295,442 B1 | * | 9/2001 | Camp et al. | 455/102 |

* cited by examiner

*Primary Examiner*—Sonny Trinh

(57) ABSTRACT

A single continuous closed-loop power control feedback system provides seamless power control for a power amplifier and also enables an AM signal to be injected into the power amplifier through the power amplifiers' control port. The AM signal is developed by an I/Q modulator and supplied to a comparator located in the power control loop. By using leakage from the power amplifier as feedback to a phase locked loop during initial power amplifier power ramp-up, the single continuous closed-loop power control system provides continuous feedback to the phase locked loop during the entire power amplification ramp-up period and eliminates the need for multiple feedback loops.

6 Claims, 5 Drawing Sheets

CONTINUOUS CLOSED-LOOP POWER CONTROL SYSTEM INCLUDING MODULATION INJECTION IN A WIRELESS TRANSCEIVER POWER AMPLIFIER

This application is a divisional of co-pending application Ser. No. 09/704,930, filed on Nov. 2, 2000, the entire disclosure of which is incorporated herein by reference.

BACKGROUND OF THE INVENTION

1. Field of the Invention

This invention relates to the versatile transmission of radio frequency power in a wireless communication device transmitter, and more particularly, to a continuous closed-loop power control system including modulation injection into a wireless transceiver's power amplifier.

2. Related Art

With the increasing availability of efficient, low cost electronic modules, mobile communication systems are becoming more and more widespread. For example, there are many variations of communication schemes in which various frequencies, transmission schemes, modulation techniques and communication protocols are used to provide two-way voice and data communications in a handheld telephone like communication handset. The different modulation and transmission schemes each have advantages and disadvantages.

As these mobile communication systems have been developed and deployed, many different standards, to which these systems must conform, have evolved. For example, in the United States, portable communications systems complying with the IS-136 standard specify the use of a particular modulation scheme and access format. In the case of IS-136, the modulation scheme can be 8-quadrature phase shift keying (8QPSK), offset π/4 differential quadrature phase shift keying (π/4-DQPSK) or variations and the access format is time division multiple access (TDMA). Other standards may require the use of, for example, code division multiple access (CDMA).

Similarly, in Europe, the global system for mobile communications (GSM) standard requires the use of the gaussian minimum shift keying (GMSK) modulation scheme in a narrowband TDMA access environment.

Furthermore, in a typical GSM mobile communication system using narrowband TDMA technology, a GMSK modulation scheme supplies a very clean phase modulated (PM) transmit signal to a non-linear power amplifier directly from an oscillator. In such an arrangement, a non-linear power amplifier, which is highly efficient, can be used, thus allowing efficient transmission of the phase-modulated signal and minimizing power consumption. Because the modulated signal is supplied directly from an oscillator, the need for filtering, either before or after the power amplifier, is minimized. Other transmission standards, such as that employed in IS-136, however, use a modulation scheme in which both a PM signal and an amplitude modulated (AM) signal are transmitted. Standards such as these increase the data rate without increasing the bandwidth of the transmitted signal. Unfortunately, existing GSM modulation schemes are not easily adapted to transmit a signal that includes both a PM component and an AM component. One reason for this difficulty is that in order to transmit a signal containing a PM component and an AM component, a highly linear power amplifier is required. Unfortunately, highly linear power amplifiers are very inefficient, thus consuming significantly more power than a non-linear power amplifier and drastically reducing the life of the battery or other power source.

This condition is further complicated because transmitters typically employed in GSM communication systems transmit in bursts and must be able to control the ramp-up of the transmit power as well as have a high degree of control over the output power level over a wide power range. In GSM this power control is typically performed using a closed feedback loop in which a portion of the signal output from the power amplifier is compared with a reference signal and the resulting error signal is fed back to the control port of the power amplifier.

When attempting to include a PM component and an AM component in a GSM type modulation system, the power control loop will attenuate the amplitude variations present in the signal in an attempt to maintain a constant output power. In such an arrangement, the power control loop tends to cancel the AM portion of the signal.

In such systems in which transmit signals contain both PM and AM components, the output power can be controlled by applying a pre-determined control voltage to the power amplifier. Unfortunately, this requires the use of a highly linear, and therefore very inefficient, power amplifier. In non-burst transmission systems the output power may be controlled by a feedback loop having a time-constant that is very low compared to the time-constant of the amplitude variations of the modulator. Another known method to control the output power is to "pre-distort" the modulated signal in such a way that the power control loop will cancel the effect of the pre-distortion. In such a method, the amplitude information is passed through a transfer function that is the inverse of the power control loop transfer function. Unfortunately, these methods are costly and inefficient.

Known multi-mode transmitter architectures require multiple variable elements, which are chosen depending upon the desired transmit mode. These architectures are complex, unreliable, require periodic calibration, and cannot support multiple transmission standards without significant adjustments to the supporting analog and digital circuitry.

Further, in those transmission standards in which both a PM signal and an AM signal are sent to a power amplifier, unless the power amplifier is very linear, it may distort the combined transmission signal by causing undesirable AM to PM conversion. This conversion is detrimental to the transmit signal and can require the use of a costly and inefficient linear power amplifier.

With the increasing desirability of developing one worldwide portable communication standard, it would be desirable to have a multi-band and multi-mode portable transceiver that can transmit a signal containing both a PM component and an AM component, while maximizing the efficiency of the power amplifier. Furthermore, it would be desirable to have such a multi-band and multi-mode portable transceiver that can use conventional in-phase (I) and quadrature (Q) transmit signal components without requiring separate baseband signals for phase modulation and amplitude modulation. Further still, as the GSM standard evolves further, such as with the development of enhanced data rates for GSM evolution (EDGE), it is desirable to have one portable transceiver that may operate in all systems.

SUMMARY

The invention provides a continuous closed-loop power control system, which includes modulation injection into a wireless transceiver's power amplifier that allows the use of non-linear, power efficient amplifiers. The invention uses a single continuous closed-loop power control system that allows an AM signal to be injected into the power amplifier through the power amplifier control port. The AM signal is derived from the output of an I/Q modulator and supplied to a comparator located within the power control feedback loop. By using the leakage from the power amplifier as feedback to a translation loop during the initial power amplifier ramp-up, continuous phase feedback to the translation loop is achieved during the entire power amplification ramp-up period, thus eliminating the need for multiple feedback loops.

Related methods of operation and computer readable media are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The components in the figures are not necessarily to scale, emphasis instead being placed upon illustrating the principles of the invention. Moreover, in the figures, like reference numerals designate corresponding parts throughout the different views.

DETAILED DESCRIPTION

Figure 1:
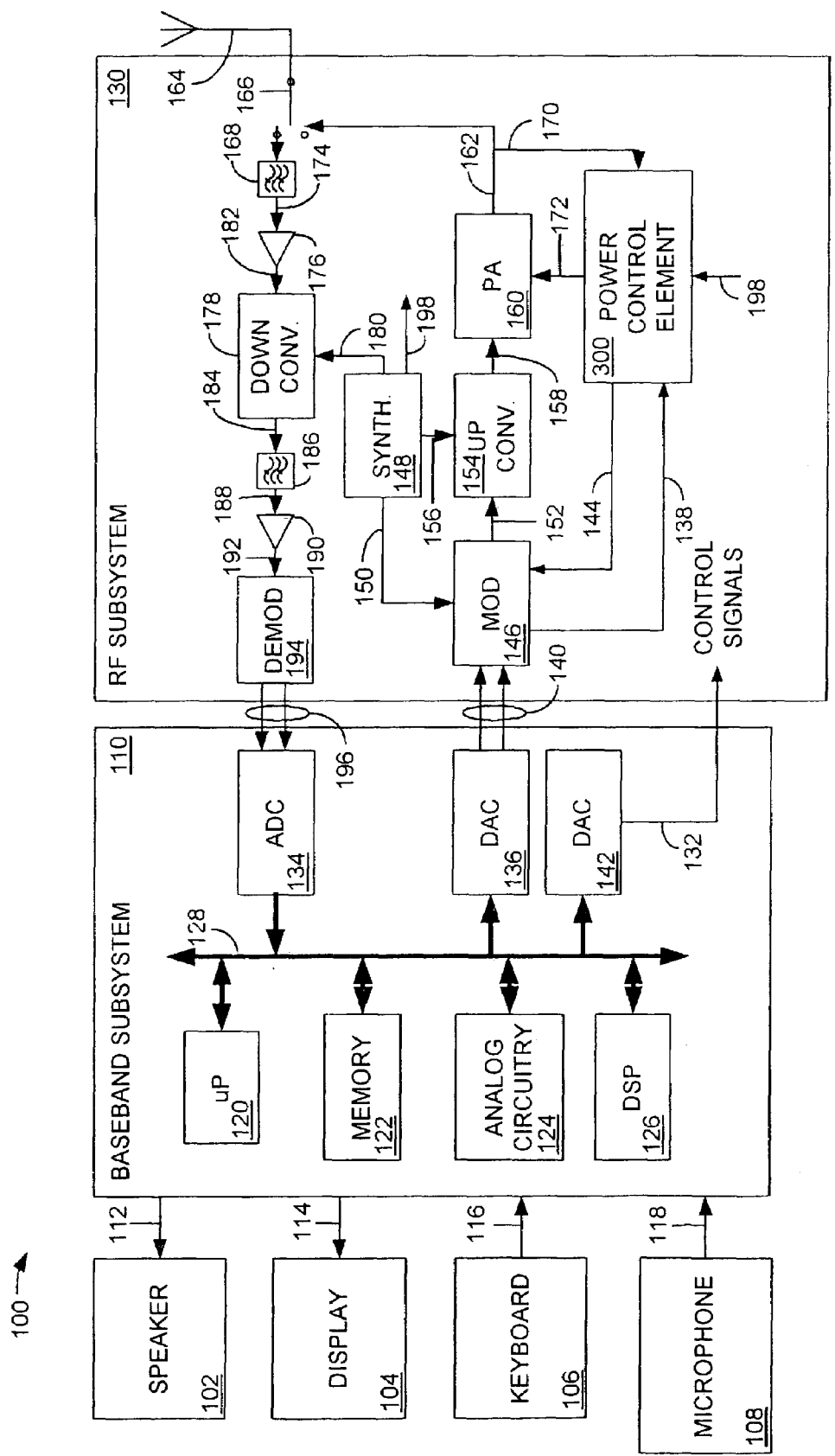
FIG. 1 is a block diagram illustrating a simplified portable transceiver.

Although described with particular reference to a portable transceiver, the continuous closed-loop power control system including modulation injection can be implemented in any system where it is desirable to transmit a combined signal including a PM component and an AM component. Furthermore, the continuous closed-loop power control system can be implemented independently from the modulation injection, where both systems are applicable to any system where it is desirable to implement a closed power control feedback loop and where a PM signal and an AM signal are amplified by a power amplifier.

Further still the continuous closed-loop power control system including modulation injection can be implemented in software, hardware, or a combination of hardware and software. In a preferred embodiment(s), selected portions of the continuous closed-loop power control system including modulation injection are implemented in hardware and software. The hardware portion of the invention can be implemented using specialized hardware logic. The software portion can be stored in a memory and be executed by a suitable instruction execution system (microprocessor). The hardware implementation of the continuous closed-loop power control system including modulation injection can include any or a combination of the following technologies, which are all well known in the art: a discrete logic circuit(s) having logic gates for implementing logic functions upon data signals, an application specific integrated circuit having appropriate logic gates, a programmable gate array(s) (PGA), a field programmable gate array (FPGA), etc.

Furthermore, the continuous closed-loop power control system including modulation injection software, which comprises an ordered listing of executable instructions for implementing logical functions, can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

FIG. 1 is a block diagram illustrating a simplified portable transceiver 100. Portable transceiver 100 includes speaker 102, display 104, keyboard 106, and microphone 108, all connected to baseband subsystem 110. In a particular embodiment, portable transceiver 100 can be, for example but not limited to, a portable telecommunication handset such as a mobile cellular-type telephone. Speaker 102 and display 104 receive signals from baseband subsystem 110 via connections 112 and 114, respectively, as known to those skilled in the art. Similarly, keyboard 106 and microphone 108 supply signals to baseband subsystem 110 via connections 116 and 118, respectively. Baseband subsystem 110 includes microprocessor (μP) 120, memory 122, analog circuitry 124, and digital signal processor (DSP) 126 in communication via bus 128. Bus 128, though shown as a single bus, may be implemented using a number of busses connected as necessary among the subsystems within baseband subsystem 110. Microprocessor 120 and memory 122 provide the signal timing, processing and storage functions for portable transceiver 100. Analog circuitry 124 provides the analog processing functions for the signals within baseband subsystem 110. Baseband subsystem 110 provides control signals to radio frequency (RF) subsystem 130 via connection 132. Although shown as a single connection 132, the control signals may originate from DSP 126 or from microprocessor 120, and are supplied to a variety of points within RF subsystem 130. It should be noted that, for simplicity, only the basic components of portable transceiver 100 are illustrated.

Baseband subsystem 110 also includes analog-to-digital converter (ADC) 134 and digital-to-analog converters (DACs) 136 and 142. ADC 134 and DACs 136 and 142 also communicate with microprocessor 120, memory 122, analog circuitry 124 and DSP 126 via bus 128. DAC 136 converts the digital communication information within baseband subsystem 110 into an analog signal for transmission to RF subsystem 130 via connection 140. Connection 140, while shown as two directed arrows, includes the information that is to be transmitted by RF subsystem 130 after conversion from the digital domain to the analog domain. In accordance with an embodiment of the invention, DAC 136 supplies baseband in-phase (I) and quadrature (Q) components of the information signal to be transmitted via connection 140 to modulator 146. In such an embodiment, modulator 146 is an I/Q modulator. DAC 142 supplies control signals to various components with RF subsystem 130 via connection 132.

Modulator 146, after receiving a frequency reference signal, also called a "local oscillator," signal, or "LO," from synthesizer 148 via connection 150, modulates the I and Q information signals received from the DAC 136 onto the LO signal and provides a modulated signal via connection 152 to upconverter 154. Modulator 146 also supplies an intermediate frequency (IF) signal containing only the desired amplitude modulated (AM) signal component on connection 138 for input to the power control element 300 via connection 138. The power control element 300 also supplies to the modulator 146 via connection 144 a constant level IF signal containing both the phase modulated (PM) and AM components of the transmit signal. The operation of the power control element 300 will be described below with reference to FIG. 2.

Upconverter 154 also receives a frequency reference signal from synthesizer 148 via connection 156. Synthesizer 148 determines the appropriate frequency to which upconverter 154 will upconvert the modulated signal on connection 152.

Upconverter 154 supplies the fully modulated signal at the appropriate transmit frequency via connection 158 to power amplifier 160. Power amplifier 160 amplifies the modulated signal on connection 158 to the appropriate power level for transmission via connection 162 to antenna 164. Illustratively, switch 166 controls whether the amplified signal on connection 162 is transferred to antenna 164 or whether a received signal from antenna 164 is supplied to filter 168. The operation of switch 166 is controlled by a control signal from baseband subsystem 110 via connection 132.

A portion of the amplified transmit signal power on connection 162 is supplied via connection 170 to power control element 300. Power control element 300 forms a continuous closed power control feedback loop and supplies an information signal on connection 172 instructing the power amplifier 160 as to the power to which the signal on connection 158 should be amplified. The power control element 300 also receives the LO signal from synthesizer 148 via connection 198. The operation of power control element 300 will be described in further detail with respect to FIG. 2.

A signal received by antenna 164 may, at the appropriate time determined by baseband subsystem 110, be directed via switch 166 to receive filter 168. Receive filter 168 will filter the received signal and supply the filtered signal on connection 174 to low noise amplifier (LNA) 176. Receive filter 168 may be a bandpass filter that passes all channels of the particular cellular system where the portable transceiver 100 is operating. As an example, for a 900 MHz GSM system, receive filter 168 would pass all frequencies from 935.1 MHz to 959.9 MHz, covering all 124 contiguous channels of 200 kHz each. The purpose of this filter is to reject all frequencies outside the desired region. LNA 176 amplifies the very weak signal on connection 174 to a level at which downconverter 178 can translate the signal from the transmitted frequency back to a baseband frequency. Alternatively, the functionality of LNA 176 and downconverter 178 can be accomplished using other elements, such as, for example but not limited to, a low noise block downconverter (LNB).

Downconverter 178 receives an LO signal from synthesizer 148, via connection 180. The LO signal determines the frequency to which to downconvert the signal received from LNA 176 via connection 182. The downconverted frequency is called the intermediate frequency (IF). Downconverter 178 sends the downconverted signal via connection 184 to channel filter 186, also called the "IF filter." Channel filter 186 filters the downconverted signal and supplies it via connection 188 to amplifier 190. The channel filter 186 selects the one desired channel and rejects all others. Using the GSM system as an example, only one of the 124 contiguous channels is actually to be received. After all channels are passed by receive filter 168 and downconverted in frequency by downconverter 178, only the one desired channel will appear precisely at the center frequency of channel filter 186. The synthesizer 148, by controlling the local oscillator frequency supplied on connection 180 to downconverter 178, determines the selected channel. Amplifier 190 amplifies the received signal and supplies the amplified signal via connection 192 to demodulator 194. Demodulator 194 recovers the transmitted analog information and supplies a signal representing this information via connection 196 to ADC 134. ADC 134 converts these analog signals to a digital signal at baseband frequency and transfers it via bus 128 to DSP 126 for further processing.

Figure 2:
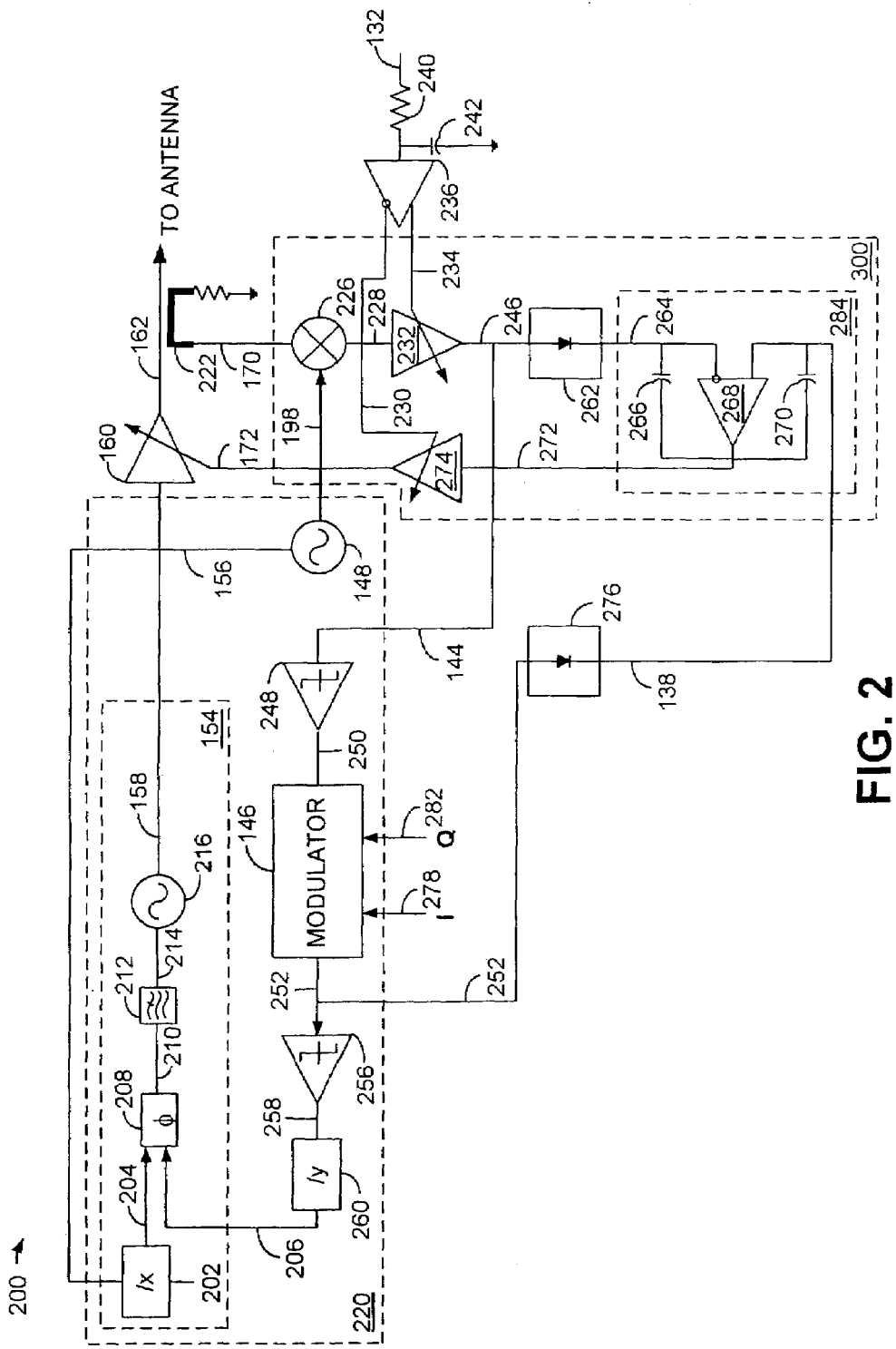
FIG. 2 is a block diagram illustrating the upconverter and power control element of FIG. 1 including the continuous closed-loop power control system of the invention.

FIG. 2 is a block diagram illustrating the upconverter 154 and power control element 300 of FIG. 1 including the continuous closed-loop power control system and modulation injection of the invention. Beginning with a description of the power control loop 300, a portion of the output power present at the output of power amplifier 160 on connection 162 is diverted by coupler 222 via connection 170 and input to mixer 226 in the power control element 300. Mixer 226 also receives the local oscillator (LO) signal from synthesizer 148 via connection 198.

The mixer 226 down converts the RF signal on connection 170 to an intermediate frequency (IF) signal on connection 228. For example, mixer 226 takes a signal having a frequency of approximately 2 gigahertz (GHz) on connection 170 and down converts it to a frequency of approximately 100 megahertz (MHz) on connection 228 for input to variable gain element 232. Variable gain element 232 can be, for example but not limited to, a variable gain amplifier or an attenuator. In such an arrangement, variable gain element 232 might have a dynamic range of approximately 70 decibels (dB) i.e., +35 dB/−35 dB. Variable gain element 232 receives a control signal input from the non-inverting output of amplifier 236 via connection 234. The input to amplifier 236 is supplied via connection 132 from the DAC 142 of FIG. 1. The signal on connection 132 is a reference voltage signal for the transmit power level and provides the power profile. This signal on connection 132 is supplied to a reconstruction filter, which includes resistor 240 and capacitor 242. In this manner, a reference voltage for the transmit power level and power profile is supplied via connection 234 to the control input of the variable gain element 232.

The output of variable gain element 232 on connection 246 is at an IF and includes modulation having both an AM component and a PM component and is called the "power measurement signal." This power measurement signal is related to the absolute output power of power amplifier 160, and includes a very small error related to the AM and PM components present in the signal. The output of variable gain element 232 on connection 246 is supplied to the input of power detector 262 and is also supplied to a limiter 248 in the phase locked loop 220. The IF signal on connection 246 includes both an AM component and a PM component. The signal on connection 246 is supplied to power detector 262, which provides, on connection 264, a baseband signal representing the instantaneous level of IF power present on connection 246. The output of power detector 262 on connection 264 is supplied to the inverting input of amplifier 268.

Amplifier 268, capacitor 266 and capacitor 270 form a comparator 284, which provides the error signal used to control the power amplifier 160 via connection 272. The non-inverting input to the amplifier 268 is supplied via connection 138 from the output of the modulator 146 through the power detector 276. The signal on connection 138 supplied to the non-inverting input of amplifier 268 contains the AM modulation developed by the modulator 146 in the phase locked loop 220 for input to the control port 172 of power amplifier 160.

The gain of the power control loop 300 amplifies the signal on connection 272 such that the difference between the signals on connections 264 and 138 input to amplifier 268 provide an error on connection 272 that is used to control the output of the power amplifier 160. The error on connection 272 is supplied to variable gain element 274, which can be similar in structure to variable gain element 232. However, the variable gain element 274 has a function that is inverse to that of variable gain element 232. The control input to variable gain element 274 is supplied from the inverting output of amplifier 236. In this manner, the power amplifier control signal on connection 172 supplied to the control port of power amplifier 160 drives the power amplifier 160 to provide the proper output on connection 162.

The level of the signal on connection 264 and the level of the signal on connection 138 should be equal. For example, if the output level of the variable gain element 232 is increased by a factor of 10, then the level of the output of power amplifier 160 should be decreased accordingly to maintain equilibrium at the input of the amplifier 268. The output of the power amplifier 160 changes to cancel the gain change of variable gain element 232. In this manner, the amplitude of the signal on connection 264 remains equal to the amplitude of the signal on connection 138. However, this implies that the signal on connection 228 lags the signal on connection 234 with the result that the two signals will not completely cancel. In this manner, an error signal with an AM and a PM portion is present on connection 246. The signal on connection 246 is converted by power detector 262 from an IF signal to a baseband signal on connection 264. The signal on connection 264 is amplified by amplifier 268 and amplifier 274 to drive the power amplifier control port on connection 172 so that the desired signal is achieved at the output of the power amplifier 160 on connection 162. Power control loop 300 has sufficient gain so that the error signal on connection 264 can be kept small. In such a case, the gain changes of variable gain element 232 and the power amplifier 160 will substantially be the inverse of each other.

In addition to amplifying the error signal on connection 264, the amplifier 268 also compares the power measurement signal on connection 264 with a reference voltage signal including an AM portion on connection 138, supplied by the modulator 146 within the phase locked loop 220. The DC voltage level on connection 138 affects the desired static output power for the power amplifier 268, irrespective of AM modulation. Amplifier 268 compares the signal level on connection 264 with the signal level on connection 138 and then amplifies the difference, thus providing a power control signal on connection 272. The comparator 284 functions as an integrator, which is also a low pass filter.

The power control signal on connection 272 drives the variable gain amplifier 274, which corrects for the effect that variable gain element 232 has on the transfer function of power control loop 300. The variable gains of variable gain element 232 and variable gain element 274 are complimentary. Because the power measurement signal is present on connection 264 and the AM error signal is present on connection 138, the amplifier 268 provides a dual function; (1) it amplifies the AM error signal on connection 138 so as to modulate the power output of power amplifier 160 via connection 172 to have the correct amount of AM; and (2) it performs the average power comparison and amplifies the result, thus providing a control signal on connection 272 that drives the power amplifier 160 to the correct average power output. Therefore, at connection 172 both the AM error signal and the power control error signal are amplified to a level sufficient to drive the power amplifier 160 to the desired average power with the desired AM signal. In this manner, the desired AM portion of the signal is supplied to the control input 172 of power amplifier 160 and made present on the power amplifier output on connection 162. Mixer 226, variable gain element 232, power detector 262, amplifier 268 and variable gain element 274 provide a continuous closed-loop power control feedback system to control the power output of power amplifier 160, while allowing for the introduction of the AM portion of the transmit signal via connection 138.

At all times, the continuous power-control feedback loop allows the correction of any phase shift caused by power amplifier 160. In this manner, the PLL 220 now includes a feedback loop for looping back the output of power amplifier 160 to the input of phase/frequency detector 208. Any unwanted phase shift generated by the power amplifier 160 will be corrected by the PLL 220. The output of variable gain element 232 passes any phase distortion present via connection 246 to limiter 248 for correction by the PLL 220. As such, the phase of the output of power amplifier 160 is forced to follow the phase of the LO signal on connection 156.

In order to remove the AM from the output of variable gain element 232, the variable gain element 232 is connected via connection 246 and connection 144 to the input of limiter 248. Limiter 248 develops a local oscillator signal containing only a PM component on connection 250. This LO signal is supplied via connection 250 to the modulator 146. In addition, the baseband I and Q information signals are supplied via connections 278 and 282, respectively, to the modulator 146. The I and Q baseband information signal interface is understood by those having ordinary skill in the art. As a result of the operation of the modulator 146, the output on connection 252 is an intermediate frequency signal including an AM component in the form of an AM reference signal and a small PM error signal. The output of modulator 146 is supplied via connection 252 to power detector 276. In this manner, the output of power detector 276 also includes the AM portion of the desired transmit signal. In this manner, the signal provided on connection 138 is a reference signal for input to the power control loop 300. Because the power control loop 300 has limited bandwidth, the rate at which the amplitude modulation occurs on connection 138 is preferably within that power control loop bandwidth.

The output of limiter 248 is supplied via connection 250 as a local oscillator signal having a PM component, but substantially no AM component to the modulator 146. The modulator 146 removes virtually the entire PM component and applies an AM modulated component to the signal and supplies this signal via connection 252. In order to remove the PM component present on connection 250, the I and Q signals are reversed on connections 278 and 282, respectively. In this manner, the output of modulator 146 on connection 252 contains a very small PM portion and a significant AM portion. With respect to the PM component of the signal on connection 252, the modulator 146 acts as a comparator, comparing the I and Q signals on connections 278 and 282, respectively, with the LO signal supplied from the output of the variable gain element 232, through limiter 248 and on connection 250. The components within the phase locked loop 220 provide gain for the comparison of the PM on connection 250 and the modulator connections 278 and 282, thus providing a phase error output of the modulator 146 on connection 252. This phase error signal is then supplied to limiter 256, which outputs a signal on connection 258 containing the small PM phase error component.

In this manner, a feedback signal taken from the output of variable gain element 232 on connection 246 is supplied as continuous feedback to the phase locked loop 220. The error signal output of modulator 146 on connection 252 containing the phase error, will get smaller and smaller as the gain of the phase locked loop 220 increases. However, there will always be some error signal present, thus enabling the phase locked loop 220 to achieve phase lock. It should be noted that even when the power amplifier 160 is not operating, there will always be some small leakage through the power amplifier 160 onto connection 162. This small leakage is sufficient to provide a feedback signal through the variable gain element 232 and into the phase locked loop 220 such that the phase locked loop 220 can be locked using just the leakage output of power amplifier 160. In this manner, a single feedback loop can be used to continuously control the output power of power amplifier 160 from the time that the amplifier is off through the time when the amplifier 160 is providing full output power.

Phase/frequency detector 208 receives an unmodulated input signal from synthesizer 148 via connection 156. The unmodulated input signal is frequency divided by a number "x" in order to provide a signal having an appropriate frequency on connection 204. The number "x" is chosen so as to minimize the design complexity of the synthesizer 148 and can be, for example, but not limited to, chosen to convert the output of the synthesizer 148 to a frequency of 100 MHz. Phase/frequency detector 208 also receives the output of divider 260 via connection 206. The number "y" is chosen in similar manner to that of the number "x." Phase/frequency detector 208 detects any phase difference between the signal on connection 204 and the signal on connection 206 and places a signal on connection 210 that has an amplitude proportional to the difference. When the phase difference reaches 360°, the output of phase/frequency detector 208 on connection 210 will become proportional to the frequency difference between the signals on connections 204 and 206.

The output of phase/frequency detector 208 on connection 210 is a digital signal having a value of either a 0 or a 1 with a very small transition time between the two output states. This signal on connection 210 is supplied to low-pass filter 212, which integrates the signal on connection 210 and places a DC signal on connection 214 that controls the frequency of the transmit voltage control oscillator (TX VCO) 216. The output of TX VCO 216 is supplied via connection 158 directly to the power amplifier 160. In this manner, the synthesizer 148, limiter 248, modulator 146, limiter 256, divider 260, divider 202, phase/frequency detector 208, low-pass filter 212 and TX VCO 216 form a phase locked loop (PLL) 200, which is used to determine the transmit frequency on connection 158. When the PLL 220 is settled, or "locked," then the two signals entering the phase/frequency detector 208 on connections 204 and 206 have precisely the same phase and frequency, and the output of the phase/frequency detector 208 on connection 210 goes to zero. The output of the integrating low-pass filter 212 on connection 214 stabilizes, resulting in a fixed frequency out of TX VCO 216. For example, the synthesizer 148 and the mixer 226 ensure that the frequency of the signal output from the TX VCO 216 on connection 158 tracks the sum of the frequencies of the local oscillator signal supplied by synthesizer 148 and the IF frequency on connection 206.

When the phase locked loop 220 is locked, the phase of the signal oil connection 204 and the phase of the signal on connection 206 will be equal. Because the amount of PM on connection 206 should be very small, the gain in the phase locked loop 220 has to be sufficiently high to amplify the error signal on connection 206 to a level at which the phase/frequency detector 208 can make a comparison. By using the modulator 146 to impose the I and Q information signals on the signal on connection 250 in a direction opposite from which it is desirable for the phase of the TX VCO to move, and because it is desirable for the phase locked loop 220 to remain locked, the phase of the signal output from the TX VCO 216 on connection 158 will move opposite that of the phase imposed by the modulator 146. In this manner, the PM error signal present on connection 206 is minimized by the very high sensitivity, of the order of many MHz per volt, of the TX VCO 216.

Because the power control loop 300 is a closed loop for AM signals at connection 138, it is possible to use a non-linear, and therefore highly efficient, power amplifier 160. Furthermore, the undesirable and detrimental AM-to-PM conversion, which occurs due to the amplitude dependence of an amplifier's phase shift, is rectified by the power amplifier 160 being included within the phase locked loop 220. By separating the AM and the PM modulation and by providing closed loop control for both the AM and PM modulation, a non-linear, and therefore highly efficient power amplifier can be used.

In some applications it is desirable to allow the power amplifier 160 to output a signal containing both an AM component and a PM component, while maintaining the power amplifier 160 as a non-linear (and therefore highly efficient) power amplifier. In such a case, the output of modulator 146 will include both a very small AM and PM component, with limiter 256 used to cancel the AM component present on connection 252, thereby preventing any AM-to-PM conversion in the phase/frequency detector 208.

Figure 3:
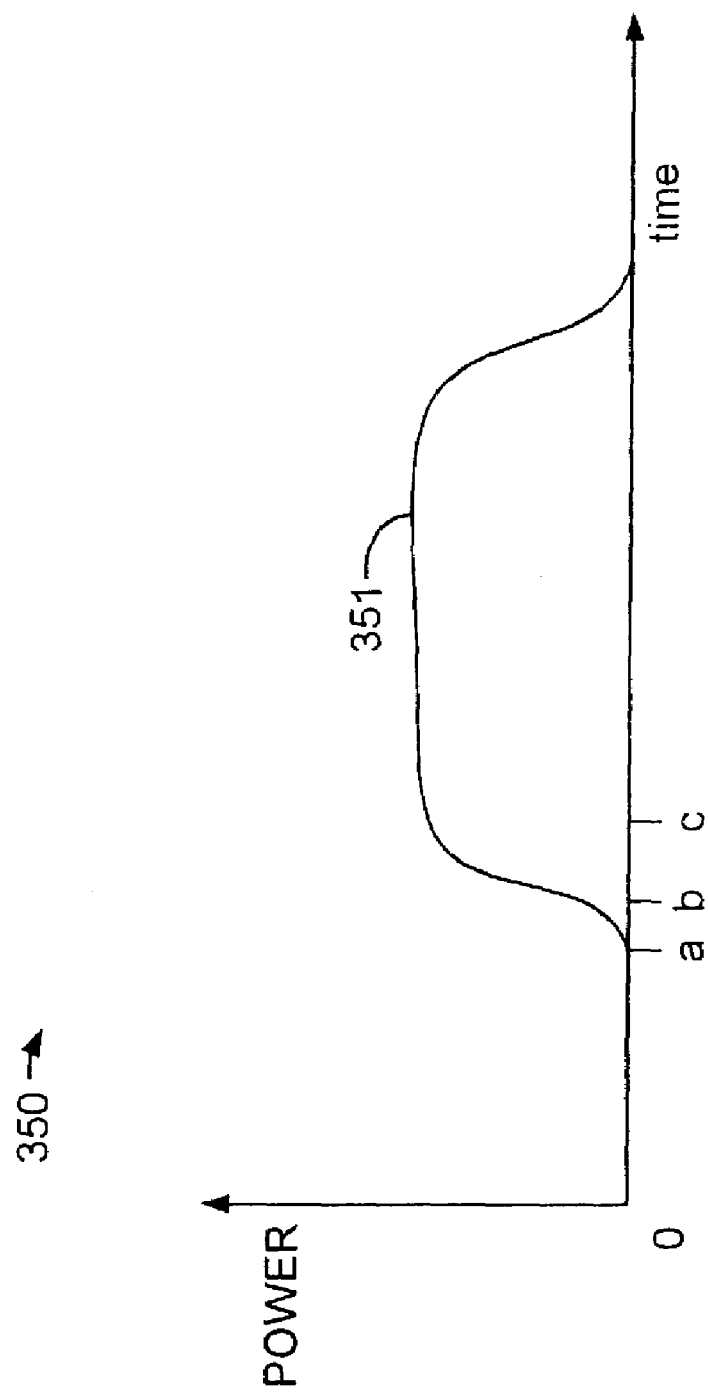
FIG. 3 is a graphical representation of the average power output of the power amplifier of FIG. 2.

FIG. 3 is a graphical representation of the average power output of power amplifier 160 of FIG. 2. The vertical axis of graph 350 represents average power output of the power amplifier 160 and the horizontal axis of graph 350 represents time. Point "a" represents the point in time at which a transmission burst is initiated. At this time leakage from the power amplifier 160 is used to provide feedback from the variable gain element 232 (FIG. 2) to the phase locked loop 220 (FIG. 2) with the variable gain element 232 set to maximum gain. During the following ramp-up time the PLL 220 of FIG. 2 tracks the output of the power amplifier 160 with the gain of variable gain element 232 (and therefore the amplitude fed back to phase locked loop 220) reducing as the ramp progresses in time, thus allowing the PLL 220 to correct any phase distortion present at the output of power amplifier 160. The point "c" in FIG. 3 represents the point at which the power amplifier 160 has developed sufficient power so that transmission of data may begin. In this manner, a single power control loop provides continuous power detection and feedback to the PILL 220.

Figure 4:
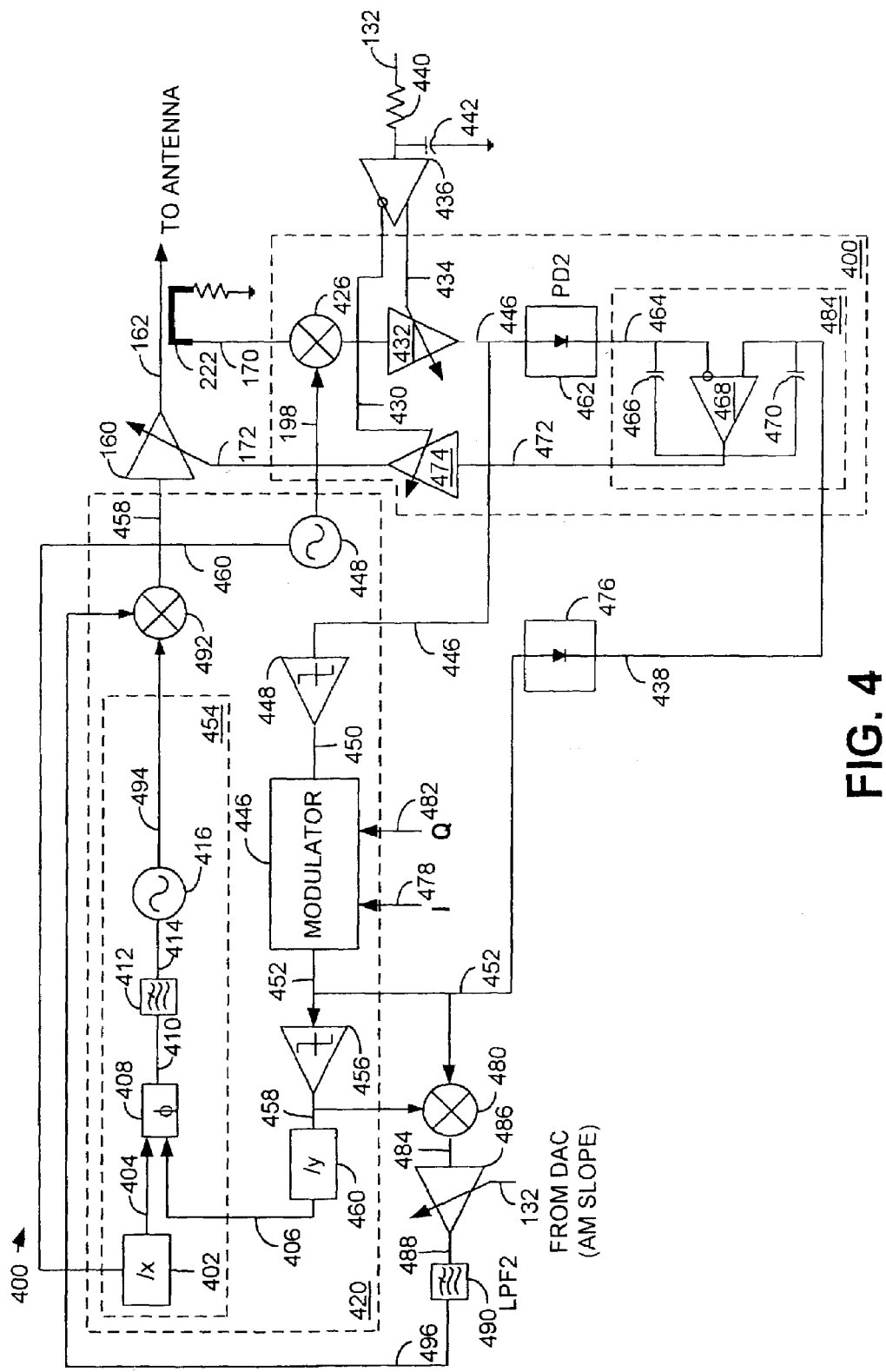
FIG. 4 is a schematic view illustrating an alternative embodiment of the power amplifier circuit of FIG. 2.

FIG. 4 is a schematic view illustrating an alternative embodiment 400 of the power amplifier circuit of FIG. 2. In some applications it may be desirable to have the ability to transmit an AM signal having a very wide bandwidth. Therefore, and in a departure from that discussed above with respect to FIG. 2, the power amplifier circuit 400 of FIG. 4 includes a mixer 492 added to the phase locked loop 420. The mixer 492 receives the output of the TX VCO 416 on connection 494 and also receives as input the output of a low-pass filter 490 via connection 496.

To develop the signal for input to the mixer 492, the output of modulator 446 on connection 452 is supplied to mixer 480. Mixer 480 combines the PM component of the signal on connection 458 with the AM component of the signal on connection 452. The mixer 480 combines the signal on connection 452 containing the AM and very small PM component and the signal on connection 458 containing the very small PM component, and combines them, thus extracting the AM signal and placing it on connection 484. The AM signal on connection 484 is at a baseband frequency and is supplied to amplifier 4.86. Amplifier 486 scales the signal on connection 484 and supplies the scaled signal, via connection 488, to low-pass filter 490. The AM slope information is supplied to the control input to the amplifier 486 from the DAC 142 via connection 132 (FIG. 1). Low-pass filter 490 removes any high frequency components from the signal on connection 488 and supplies the AM signal via connection 496 to the mixer 492.

The mixer 492 combines the AM signal on connection 496 with the PM signal supplied from the TX VCO 416 on connection 494 and supplies a combined modulated signal containing both AM and PM on connection 458. This combined signal is then supplied to the power amplifier 160.

With respect to the power control loop 400, as described above, a reference voltage signal containing the AM signal component is supplied from the output of the modulator 446 via connection 438 to the non-inverting input of amplifier 468 in the comparator 484. The signal supplied from power detector 462 via connection 464 contains an AM component. Because the AM signal component on connection 464 is in phase with respect to the AM signal component on connection 438, the two AM components will substantially cancel in the comparator 484, thus eliminating the AM portion of the signal from the output of amplifier 468 on connection 472. The output of amplifier 468 on connection 472 is the error signal used to adjust the output power of power amplifier 160 as described above.

Figure 5:
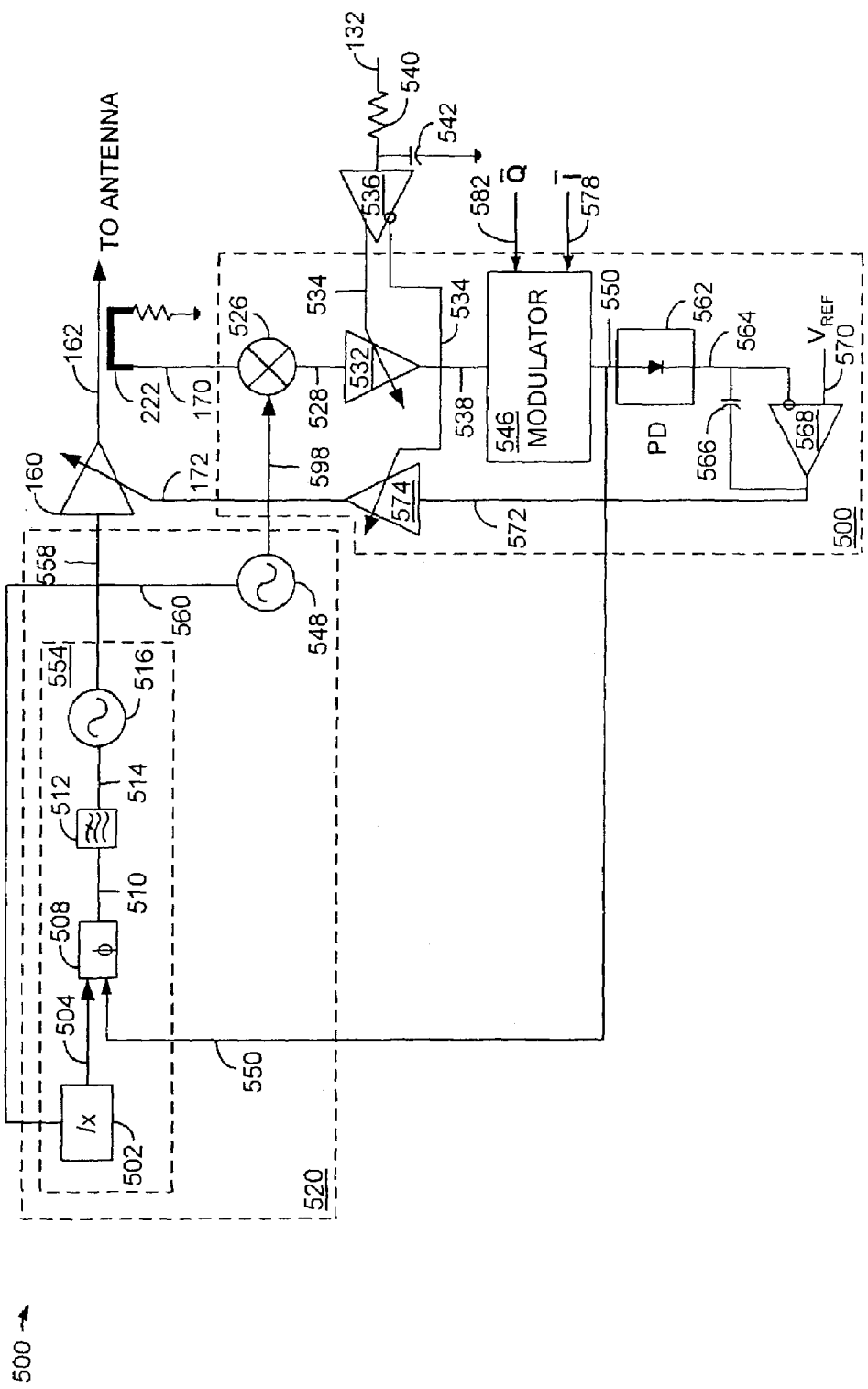
FIG. 5 is a schematic view illustrating another alternative embodiment of the power amplifier circuit of FIG. 2.

FIG. 5 is a schematic view illustrating another alternative embodiment 500 of the power amplifier circuit of FIG. 2. The power amplifier circuit 500 includes power control loop 500, where modulator 546 is placed at the output of variable gain element 532. The input signal to modulator 546 on connection 538 is a constant level signal supplied by variable gain element 532. The output of variable gain element 532 includes both an AM and PM component. The baseband I and Q information signals are supplied to the modulator 546 via connections 578 and 582, respectively.

With respect to the PM signal on connection 538, when a PM signal is supplied to modulator 546, the I and Q components will remove, or greatly reduce the level of the PM signal on connection 538 within the loop bandwidth of phase locked loop 520. With respect to the AM portion of the signal on connection 538, the I and Q positions will also reduce the AM component by a function equal to the gain of the power control loop 500. Therefore, the value of the AM and PM components at the output of modulator 546 on connection 550 are very small error signals as mentioned above. In accordance with this aspect of the invention, the inverse of the I and Q information signals are supplied to the modulator 546 on connections 578 and 582, respectively, thus providing the error signal on connection 550. The error signal on connection 550 includes both PM and AM components.

This small error signal is supplied on connection 550 to the phase/frequency detector 508, which, because there is virtually no AM present on the signal on connection 550, will measure the phase difference between the signal on connection 550 and the signal on connection 504. The phase/frequency detector 508 provides a signal on connection 510 as described above with respect to FIG. 2.

The error signal on connection 550 is also supplied to power detector 562, which converts the IF signal on connection 550 to a DC plus small AM error signal on connection 564, the DC component representing the average power output of power amplifier 160. The signal on connection 564 is supplied to the inverting input of amplifier 568. The non-inverting input to amplifier 568 is coupled from a common mode voltage signal $V_{REF}$. Amplifier 568 functions as a phase inverter, thus inverting the phase of the signal on connection 564 and supplying this inverted phase signal as a power amplifier control signal on connection 572. The control signal on connection 572 is supplied to variable gain element 574, which functions similar to the variable gain element 274 of FIG. 2. The variable gain element 574 supplies a control output to the power amplifier 160 via connection 172.

Advantageously, the embodiment illustrated in FIG. 5 eliminates one of the power 2c detectors (power detector 276) shown in FIG. 2. In this manner, it is unnecessary to match the operational characteristics of the power detector 276 and the power detector 262 of FIG. 2. Furthermore, the limiters 248 and 256 of FIG. 2 are also eliminated.

While various embodiments of the invention have been described, it will be apparent to those of ordinary skill in the art that many more embodiments and implementations are possible that are within the scope of this invention Accordingly, the invention is not to be restricted except in light of the attached claims and their equivalents.

What is claimed is:

1. A power amplifier control circuit, comprising:
   a power amplifier;
   a power control loop coupled to the power amplifier; and
   a phase locked loop coupled to the power control loop, where the power control loop provides a feedback signal to the phase locked loop, the feedback signal derived using leakage from the power amplifier during a time when the power amplifier is not operating.

2. The circuit of claim 1, wherein the power control loop provides a feedback signal to the phase locked loop, the feedback signal derived from the output power of the power amplifier during a time when the power amplifier is operating.

3. A method for operating a power amplifier, the method comprising the steps of:

provided a power amplifier and a power control loop;

developing a feedback signal in the power control loop; and providing the feedback signal to a phase locked loop, the feedback signal derived using leakage from the power amplifier during a time when the power amplifier is not operating.

4. The method of claim 3, further comprising the step of deriving the feedback signal from the output power of the power amplifier during a time when the power amplifier is operating.

5. A computer readable medium having a program for operating a power amplifier, the program comprising logic for performing the steps of:

providing a power amplifier and a power control loop;

developing a feedback signal in the power control loop; and providing the feedback signal to a phase locked loop, the feedback signal derived using leakage from the power amplifier during a time when the power amplifier is not operating.

6. The program of claim 5, further comprising logic for performing the step of deriving the feedback signal from the output power of the power amplifier during a time when the power amplifier is operating.

* * * * *